(12) United States Patent
Chambers, III et al.

(10) Patent No.: US 12,320,779 B2
(45) Date of Patent: Jun. 3, 2025

(54) THICK-FILM TRANSDUCER ARRAYS AND CONTROL FIELD

(71) Applicant: Structural Integrity Associates, Inc., San Jose, CA (US)

(72) Inventors: Robert Edward Chambers, III, Bloomsburg, PA (US); Jason Kenneth Van Velsor, Julian, PA (US); Owen Michael Malinowski, Gilbertsville, PA (US)

(73) Assignee: Structural Integrity Associates, Inc., San Jose, CA (US)

( * ) Notice: Subject to any disclaimer, the term of this patent is extended or adjusted under 35 U.S.C. 154(b) by 372 days.

(21) Appl. No.: 17/867,803

(22) Filed: Jul. 19, 2022

(65) Prior Publication Data

US 2023/0019897 A1    Jan. 19, 2023

Related U.S. Application Data

(60) Provisional application No. 63/223,174, filed on Jul. 19, 2021.

(51) Int. Cl.
*G01N 29/22* (2006.01)
*B06B 1/02* (2006.01)
(Continued)

(52) U.S. Cl.
CPC ......... *G01N 29/221* (2013.01); *B06B 1/0215* (2013.01); *B06B 1/0622* (2013.01);
(Continued)

(58) Field of Classification Search
CPC ............. G01N 29/221; G01N 29/0654; G01N 29/2245; G01N 29/069; G01N 29/262;
(Continued)

(56) References Cited

U.S. PATENT DOCUMENTS

| 5,938,612 A | * | 8/1999 | Kline-Schoder | ........ B06B 1/064 |
| | | | | 600/459 |
| 6,878,607 B2 | * | 4/2005 | Inoue | ................ H01L 21/76264 |
| | | | | 438/455 |

(Continued)

FOREIGN PATENT DOCUMENTS

CN    108406135    *   8/2018   ......... B23K 26/0853

*Primary Examiner* — Jacques M Saint Surin
(74) *Attorney, Agent, or Firm* — Seth L. Hudson; Maynard Nexsen PC (57) ABSTRACT

A method of fabricating and controlling a thick-film transducer array for steering and focusing ultrasonic waves within a substrate volume is provided. A ceramic film composition can be coated on a substrate volume in one or more layers. The ceramic film can be masked with a plastic sheet out of which an electrode pattern is cut. Conductive electrode material can be applied to the pattern to create a transducer array that can be polarized with an applied electric field. A method of controlling a thick-film transducer array comprises exciting one or more array elements to generate a wavefield in a substrate volume, the wavefield can be reflected by features within the substrate volume, one or more array elements can receive reflected wavefield signals, and images of the insonified substrate volume can be generated.

11 Claims, 7 Drawing Sheets

(51) Int. Cl.
  *B06B 1/06* (2006.01)
  *G01N 29/06* (2006.01)
  *G01N 29/24* (2006.01)
  *H10N 30/045* (2023.01)
  *H10N 30/079* (2023.01)

(52) U.S. Cl.
  CPC ....... *G01N 29/0654* (2013.01); *G01N 29/245* (2013.01); *H10N 30/045* (2023.02); *H10N 30/079* (2023.02); *G01N 2291/0289* (2013.01); *G01N 2291/106* (2013.01)

(58) Field of Classification Search
  CPC ........ G01N 2291/089; G01N 2291/106; B06B 1/0215; B06B 1/0622; B06B 1/0629; H10N 30/045; H10N 30/079; H10N 30/06; H10N 30/074; G01H 11/08; G10K 11/34
  USPC .......................................................... 73/628
  See application file for complete search history.

(56) References Cited

U.S. PATENT DOCUMENTS

| | | | | |
|---|---|---|---|---|
| 9,263,663 B2* | 2/2016 | Barthe | .................. | B06B 1/0622 |
| 9,812,634 B2* | 11/2017 | Barthe | .................. | H10N 30/06 |
| 11,883,846 B2* | 1/2024 | Barrett | .................. | B06B 1/0622 |

* cited by examiner

THICK-FILM TRANSDUCER ARRAYS AND CONTROL FIELD

CROSS REFERENCE TO RELATED PATENT APPLICATION

The present patent application/patent claims the benefit of priority of co-pending U.S. Provisional Patent Application No. 63/223,174, filed on Jul. 19, 2021, and entitled "THICK-FILM TRANSDUCER ARRAYS AND CONTROL FIELD," the contents of which are incorporated in full by reference herein.

FIELD OF THE INVENTION

The technology described herein generally relates to transducer arrays, more specifically thick-film transducer arrays for controlling ultrasonic waves within a substrate volume.

BACKGROUND OF THE INVENTION

Phased array ultrasonic testing is a specific ultrasonic testing technique that uses a sensor consisting of multiple individually controllable elements to steer and focus the generated wavefield to improve detectability and sensitivity. It requires costly, complex probes and multi-channel instrumentation. Ultrasonic testing is traditionally done on a periodic basis as the instrumentation and sensors are expensive and not typically designed for long-term installation. This often requires the test component, such as high-temperature piping, to be removed from service before it can be tested. Accessing the test locations and preparing for the ultrasonic examinations can also be costly, often requiring the construction of scaffolding, removal of insulation, and/or special surface preparation.

Piezoelectric thick-films have been used to create ultrasonic sensors that are installed/fabricated directly on the component surface and can withstand high temperatures. Piezoelectric materials have a unique property where they will generate an electric charge when the material is deformed. Conversely, they will also deform when an electric potential is placed across them. Traditional ultrasound probes make use of piezoelectric crystals to generate and receive sound. By combining a piezoelectric powder with a binding agent, one can create a suspension that can be applied directly to a metal substrate. The result is a piezoelectric film that is mechanically bonded to the component. In order to use the film as a transducer, the film must be polarized by applying an electric potential between the top of the film and the metal substrate. Once the film is polarized, it can be controlled by standard ultrasonic testing instruments to generate and receive signals. To date, these sensors have been limited to relatively basic configurations, often for component thickness measurement.

Accordingly, the technology described herein provides a process for creating a thick-film sensor array and a method for controlling said array that provides similar results as traditional phased array ultrasonic testing. The presented process and method provide a cost-effective means for creating a permanently installed probe that can be used for long-term monitoring. The permanently installed probe can be operated at temperatures that exceed the limits of traditional ultrasound probes, allowing for continuous monitoring even when a component is in service. Furthermore, one aspect of the claimed control method requires an instrument with just a single multiplexed excitation channel and a single receiving channel, significantly minimizing the cost of the necessary control electronics.

BRIEF SUMMARY OF THE INVENTION

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

Embodiments of the technology described herein are directed towards the fabrication and use of thick-film transducer arrays for controlling (e.g. steering and focusing) ultrasonic waves generated by an array within a solid volume (i.e. substrate volume).

According to some embodiments, a method for fabricating a thick-film transducer array is provided. A solid-liquid suspension can be mixed, where the solid-liquid suspension is about 50 wt % ceramic powder and about 50 wt % of an aqueous inorganic binder solution. The solid-liquid suspension can be coated onto a substrate volume, for example in one or more layers, to create a ceramic film coating with a desired thickness. The ceramic film coating can subsequently be masked with a thin sheet out of which an electrode pattern can be cut or created to generate a high resolution electrode pattern. The masked area of the ceramic film coating and/or the electrode pattern can be applied with a conductive ectrode material such that the conductive electrode material is transferred onto the ceramic film coating in the electrode pattern to generate a hick-film transducer array. The thick-filfn transducer array and/or the substrate volume can be heated and applied ith a large electric potential difference between the substrate volume and the electrodes to align the dipoles in the array elements of the thick-film transducer array.

According to some further embodiments, a method for implementing and controlling a thick-film transducer array is provided. For instance, a polycrystalline ceramic thick-film transducer array can be provided having one or more array elements (the array elements made up of conductive electrode material), where the thick-film transducer array is deposited or otherwise disposed on a substrate volume. A single array element or a plurality of array elements can be excited (i.e. with an energy source) to actively or passively generate one or more interference patterns in the generated ultrasonic wavefield within the substrate volume based on the excited array element(s) and the timing of the excitation. Wavefield components of the generated ultrasonic wavefield can be reflected by one or more surfaces, anomalies, and other various reflectors within the substrate volume. Reflected wavefield components can be received by the thick-film transducer array by way of one or a plurality of array elements. The received wavefield components or signals can subsequently be processed to generate one or more representative images of the insonified substrate volume or portions thereof.

Additional objects, advantages, and novel features of the invention will be set forth in part in the description which follows, and in part will become apparent to those skilled in the art upon examination of the following, or can be learned by practice of the invention.

BRIEF DESCRIPTION OF THE DRAWINGS

Aspects of the technology presented herein are described in detail below with reference to the accompanying drawing figures, wherein.

DETAILED DESCRIPTION OF THE INVENTION

The subject matter of aspects of the present disclosure is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" can be used herein to connote different elements of methods employed, the terms should not be interpreted as implying any particular order among or between various steps disclosed herein unless and except when the order of individual steps is explicitly described.

Accordingly, embodiments described herein can be understood more readily by reference to the following detailed description, examples, and figures. Elements, apparatus, and methods described herein, however, are not limited to the specific embodiments presented in the detailed description, examples, and figures. It should be recognized that the exemplary embodiments herein are merely illustrative of the principles of the invention. Numerous modifications and adaptations will be readily apparent to those of skill in the art without departing from the spirit and scope of the invention.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10" or "5 to 10" or "5-10" should generally be considered to include the end points 5 and 10.

Further, when the phrase "up to" is used in connection with an amount or quantity; it is to be understood that the amount is at least a detectable amount or quantity. For example, a material present in an amount "up to" a specified amount can be present from a detectable amount and up to and including the specified amount.

Additionally, in any disclosed embodiment, the terms "substantially," "approximately," and "about" may be substituted with "within [a percentage] of" what is specified, where the percentage includes 0.1, 1, 5, and 10 percent.

Ultrasonic testing is a nondestructive evaluation method used in industrial settings for identifying flaws, defects, or other anomalies in a component or structure. Ultrasonic transducers are used in these examinations to transmit and receive ultrasound by converting an electrical signal into a high frequency sound wave and then converting the reflected sound wave back into an electrical signal. Once transmitted into the component that is being inspected, the sound waves will reflect off flaws or defects back towards the transducer. By analyzing the reflected energy amplitude and amount of time between transmission and reception of the ultrasound signal, one can determine the presence and location of potential flaws inside of the component, for instance, the distance between the ultrasonic transducer and a flaw.

According to various embodiments of the technology described herein, a process or method for creating a thick-film sensor array and a method for controlling an array that provides similar results as traditional phased array ultrasonic testing is provided. The process and method provide cost-effective means for creating a permanently installed probe that can be used for long-term monitoring of a substrate volume (e.g. a component). A permanently installed probe can be operated at temperatures that exceed the limits of traditional ultrasound probes, allowing for continuous monitoring even when a component is in service. Furthermore, one aspect of the claimed control method requires an instrument with just a single multiplexed excitation channel and a single receiving channel, significantly minimizing the cost of the necessary control electronics.

According to some aspects of the present technology, a method or fabricating a thick-film transducer array is provided. A solid-liquid suspension can be mixed, where the solid-liquid suspension is composed of a ceramic powder and an aqueous inorganic binder. In some instances, the ceramic powder can be present in an amount from about 40 wt % to about 60 wt %, more particularly about 50 wt %, In some instances, the aqueous inorganic binder solution can be present in an amount from about 40 wt % to about 60 wt %, more particularly about 50 wt %. The total weight percent for the ceramic powder and aqueous inorganic binder solution is 100 weight percent. In some instances, the ceramic powder can be a piezoelectric powder, for example, lead zirconate titanate, bismuth titanate, barium titanate, lithium niobate, neodymium titanate, or a mixture of any of the forgoing. In some instances, the aqueous inorganic binder solution can be sodium silicate, lithium silicate, potassium silicate, or a combination of any of the forgoing.

The solid-liquid suspension can be coated onto a substrate volume, for example, in one or more layers, to create a ceramic film coating with a desired thickness. It will be appreciated that in some embodiments the ceramic film coating may be applied to another substrate and/or another substrate volume and subsequently affixed to the substrate volume. The solid-liquid suspension can be coated onto or otherwise applied to the substrate volume by, for example, nebulization with a pressurized device fitted with an atomizing nozzle. It will be appreciated that the thickness of the ceramic film coating may be dependent on a desired or required resonant frequency of the transducer and/or properties of the substrate volume. In some instances, the ceramic film coating can have a thickness from about 125 μm to about 200 μm.

The substrate volume (or component or volume) to which the ceramic film is applied may be any suitable material, for instance, an electrically conductive metal, such as aluminum, stainless steel, carbon steel, grade 11 steel, grade 22 steel, and grade 91 steel, amongst others.

The ceramic film coating can subsequently be masked with a thin sheet, for example a polymeric or plastic thin sheet or film mask. In some instances, the masking material can be polyethylene terephthalate (PET) or a polyvinyl chloride (PVC). The thin sheet or film mask can be, for example, a patterned template.

An electrode pattern can be cut or created out of the masking material to generate a high resolution electrode pattern, for example, by utilizing a computerized cutting machine. The masked area of the ceramic film coating and/or the electrode pattern can then be applied with a conductive electrode material. The electrode material can be made up of a suspension of a conductive powder and a binder or system of binders. In some instances, the conductive powder can be a silver powder, gold powder, platinum powder, graphite powder, or a combination of any of the forgoing. In some instances, the electrode material can be applied to the ceramic film coating by, for example, nebulization with a pressurized device fitted with an atomizing nozzle.

The ceramic film coating and/or the substrate volume can be heated and applied with a large electric potential difference between the substrate volume and the electrode to align the dipoles in the ceramic film, thereby creating a thick-film transducer array deposited or otherwise disposed on a substrate volume.

According to some aspects of the present technology, a method for controlling or otherwise using a thick-film transducer array is provided. A thick-film transducer array can be provided having one or more array elements, for example a polycrystalline ceramic thick-film, where the thick-film transducer array is deposited or otherwise disposed on a substrate volume. A single array element or a plurality of array elements can be excited to actively or passively generate one or more interference patterns in the generated ultrasonic wavefield within the substrate volume based on the excited array element(s). In some instances, one or more array elements can be excited via a pulse, for example a unipolar or bipolar square wave, a spike pulse, or a windowed sine wave.

Wavefield components of the generated ultrasonic wavefield can be reflected by one or more surfaces, anomalies, and other various reflectors within the substrate volume. Reflected wavefield components can be received by the thick-film transducer array by way of one or a plurality of array elements. The received wavefield components or signals representing the received wavefield components can subsequently be processed to generate one or more representative images of the insonified substrate volume or portions thereof.

In one aspect, a single array element of a transducer array can be excited, e.g. via one or more pulses, which in turn can generate a wave pattern within a substrate volume. The excited (i.e. generated) wavefield can be reflected by one or more features within the substrate volume and can be received and recorded by one or more of the array elements of the transducer array. The excitation-reception process can be repeated sequentially for a plurality of the array elements of the transducer array to generate a matrix of received signals which can subsequently be processed to simulate the effect of a steered and/or focused wavefield and generate one or more representative images of the insonified substrate volume or portions thereof. In some instances, the matrix of received signals can be processed using Total Focusing Method, Synthetic Aperture Focusing, Inverse Wave Extrapolation, Sectorial Total Focusing, Common Source Method, or other suitable similar or derivative algorithms. It will be appreciated that in some instances multiple grouped adjacent array elements may be excited rather than a single array element.

In some instances, one or more (e.g. a portion or all) array elements can be excited for a predetermined set of excitation time delays which can actively steer the generated wavefield in a specific direction within the substrate volume and/or focus the generated wavefield at a specific portion or point within the substrate volume. The excited (i.e. generated) wavefield can be reflected by one or more features within the substrate volume and can be received and recorded by one or more (e.g. a portion or all) of the array elements of the transducer array. The individually received signals from each array element can be combined to generate a single signal associated with a specific steering direction and/or focal point. Sequential repetition of the excitation-reception process can be carried out until the excited wavefield has been steered and/or focused to all desired or relevant directions and/or locations within the substrate volume. The received signals (a matrix of received signals) can subsequently be processed to generate one or more representative images of the insonified substrate volume or portions thereof. In some instances, the received signals can be conditioned using one or more analog and/or digital filters, and/or processed through the application of delay laws and summation techniques. In some instances, processing received signals can be performed in the time and/or frequency domain. In some instances, the matrix of received signals is processed using a Plane Wave Imagining algorithm or other similar or derivative algorithm. In some instances, the processing of a matrix of received signals passively simulates the effect of focusing the wavefield at discrete points along the wave propagation axis in each of the steering directions to generate one or more images of the insonified substrate volume or portions thereof.

Figure 1A:
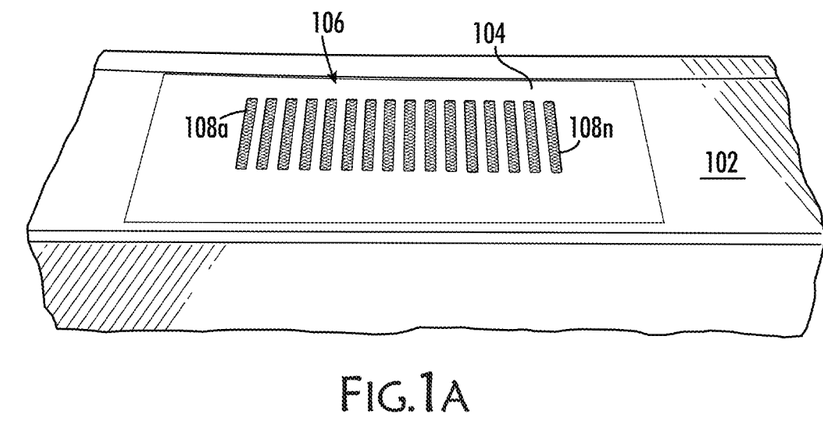
FIGS. 1A-B show diagrams of example thick-film transducer arrays in accordance with some aspects of the technology described herein.
Figure 1B:
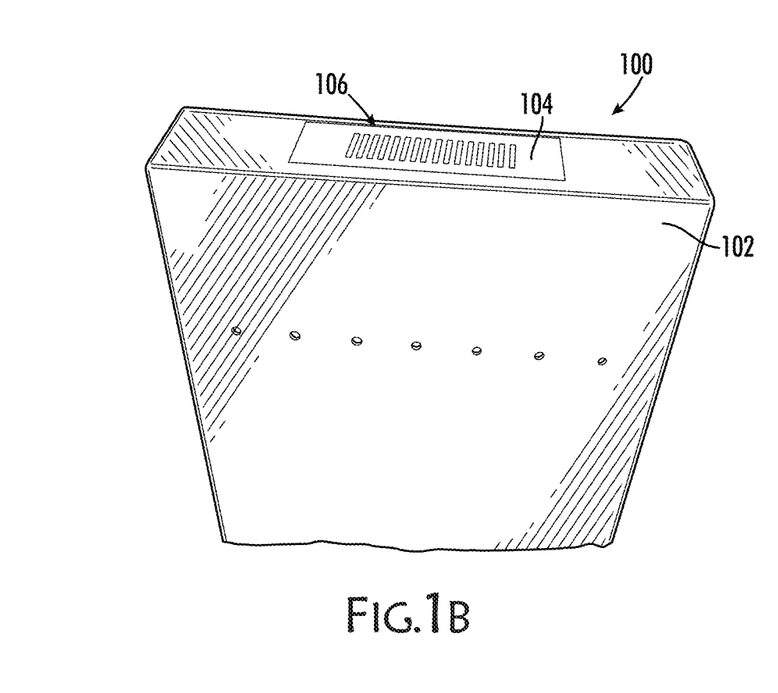

Referring now to the figures, with reference to FIGS. 1A-B, FIG. 1A depicts a diagram of an example thick-film transducer array disposed on a substrate volume 100 with which some embodiments of the present disclosure can be employed for the control of ultrasonic waves within a substrate volume and simulate an insonified substrate volume. It should be understood that this and other arrangements described herein are set forth as only examples. Other arrangements and elements can be used in addition to, or instead of, those shown, and some elements can be omitted altogether for the sake of clarity. Among components shown are substrate volume 102, ceramic film coating 104 and a transducer array 106 made up of a plurality of electrodes or array elements 108a-108n.

Figure 2:
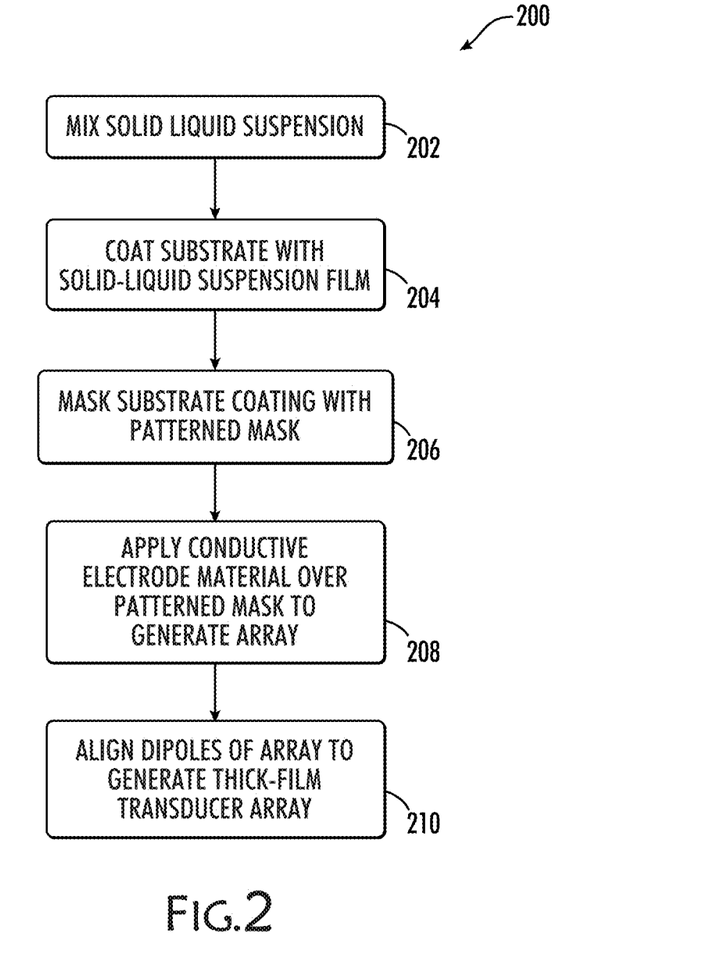
FIG. 2 is a flow diagram showing a method for fabricating a thick-film transducer array, in accordance with some aspects of the technology described herein.

Turning now to FIG. 2, a flow diagram is provided illustrating one example method 200 for fabricating a thick-film transducer array. It is contemplated that method 200 and other methods described herein are not limited to those illustrated and can incorporate other blocks or steps at any point in the method in accordance with the present disclosure. At step 202 a solid-liquid suspension can be mixed, for example the solid-liquid suspension can be about 50 wt % ceramic powder and about 50 wt % of an aqueous inorganic binder solution. The total weight percent for the ceramic powder and aqueous inorganic binder solution is 100 weight percent. At step 204, the solid-liquid suspension can be coated onto a substrate volume e.g., substrate volume 102 of FIG. 1), for example in one or more layers, to create a ceramic film coating with a desired thickness. At step 206 the ceramic film coating can subsequently be masked with a thin sheet out of hich an electrode pattern can be cut or created to generate a high resolution electrode pattern. At step 208 The masked area of the ceramic film coating and/or the electrode pattern can be applied with a conductive electrode material, and the ceramic film coating and/or the substrate volume can be heated and subjected to a large electric field (e.g. such that there is a large electric potential difference between the substrate volume and the electrode) to align the dipoles in the ceramic film.

Figure 3:
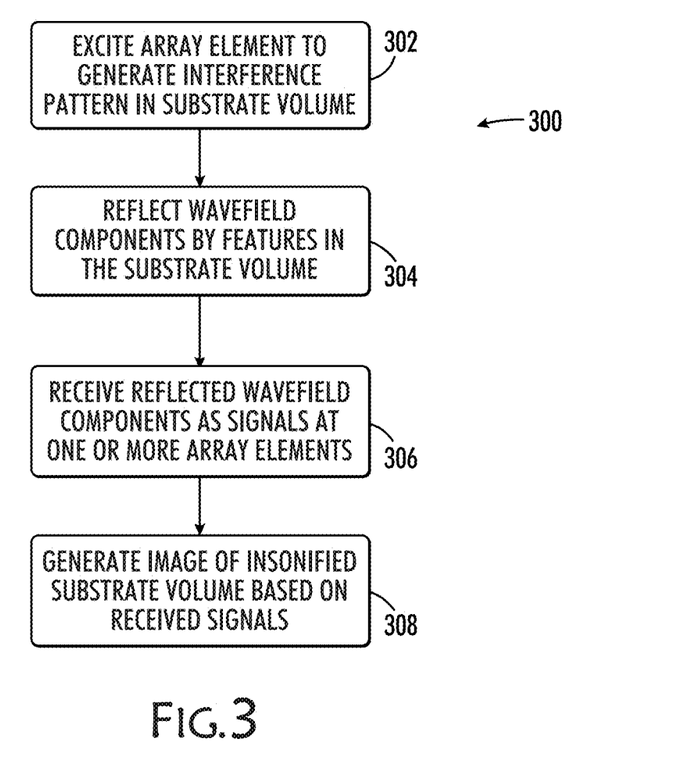
FIG. 3 is a flow diagram showing a method of controlling a thick-film transducer array, in accordance with some aspects of the technology described herein.

Referring to FIG. 3, a flow diagram is provided illustrating one example method 300 for implementing a thick-film transducer array is provided. At step 302 a single array element or a plurality of array elements can be excited to actively or passively generate one or more interference patterns in the generated ultrasonic wavefield within the substrate volume based on the excited array element(s). At step 304, wavefield components of the generated ultrasonic wavefield can be reflected by one or more surfaces, anomalies, and other various reflectors within the substrate volume. At step 306, reflected wavefield components can be received by the thick-film transducer array by way of one or a plurality of array elements. At step 308, the received wavefield components or signals can subsequently be processed to generate one or more representative images of the insonified substrate volume or portions thereof.

Figure 4A:
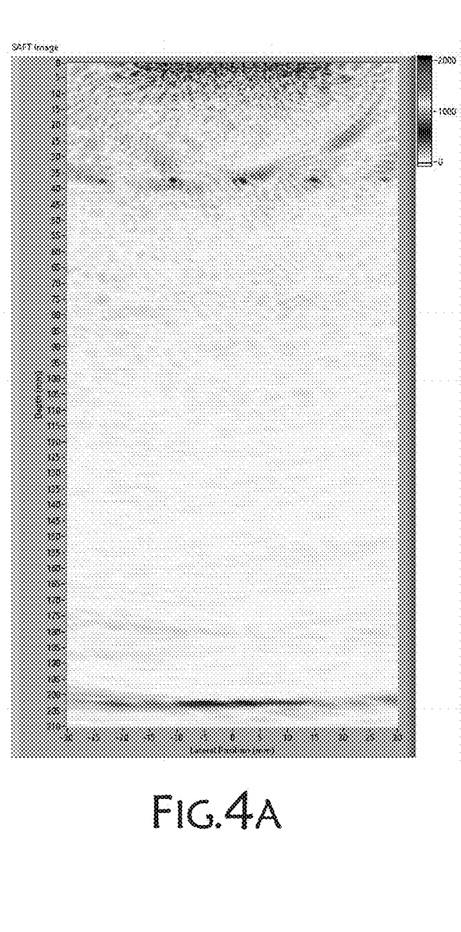
FIGS. 4A-B are synthetic aperture focusing technique (SAFT) and total focusing method (TFM) images illustrating an example implementation of a thick-film transducer, in accordance with some aspects of the technology described herein.
Figure 4B:
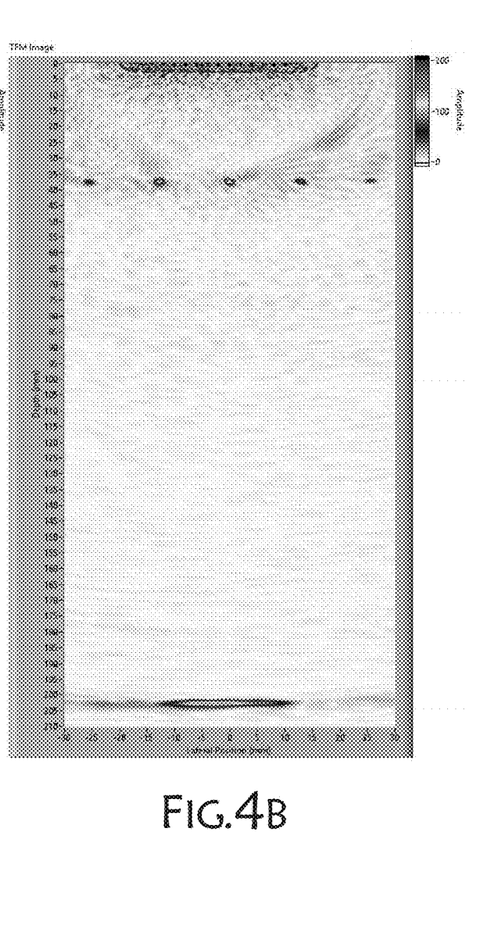
Figure 5A:
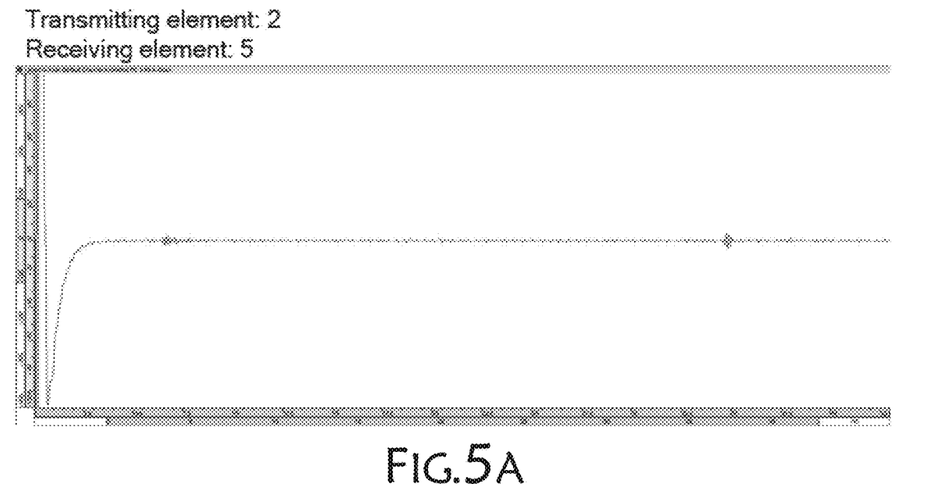
FIGS. 5A-B are waveforms from example fabricated thick-film transducers, in accordance with some aspects of the technology described herein.
Figure 5B:
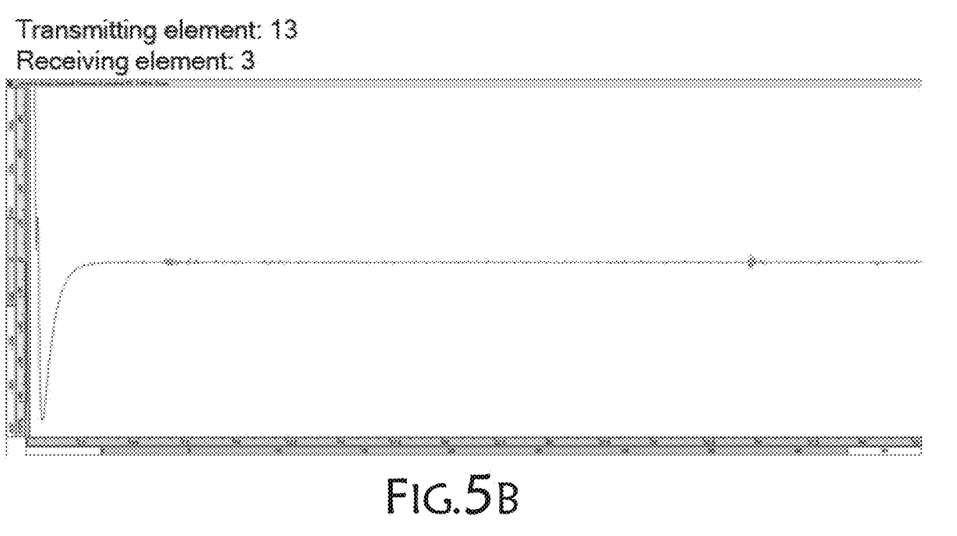
Figure 6A:
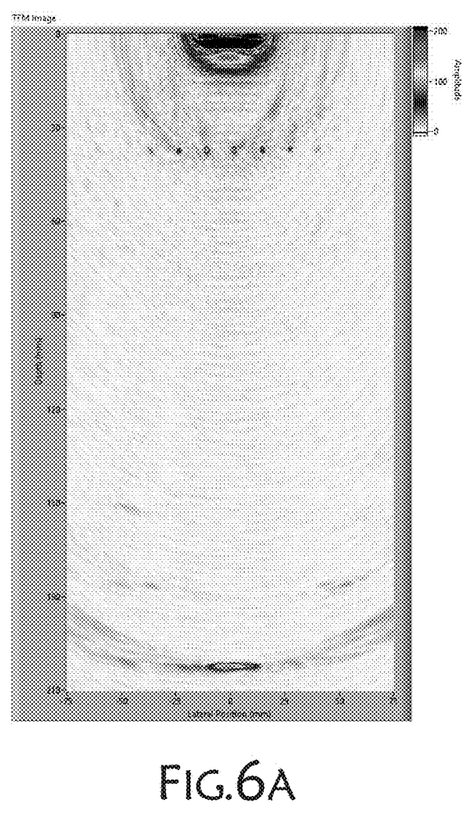
FIGS. 6A-B are TFM images illustrating an example implementation of a thick-film transducer, in accordance with some aspects of the technology described herein.
Figure 6B:
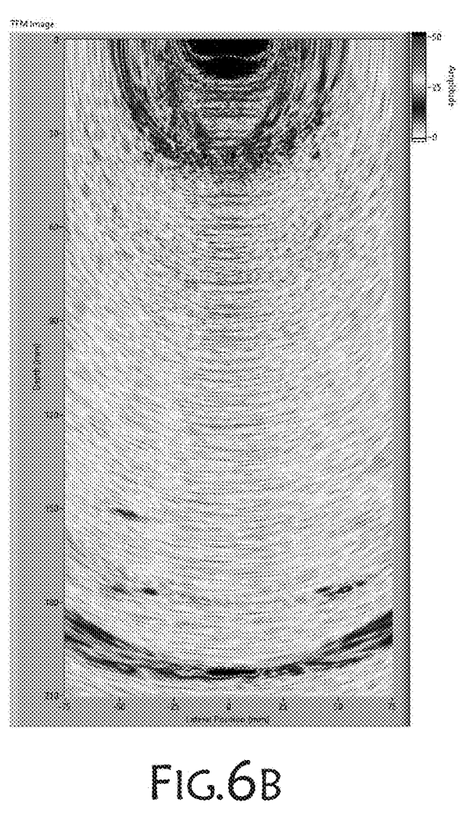
Figure 7:
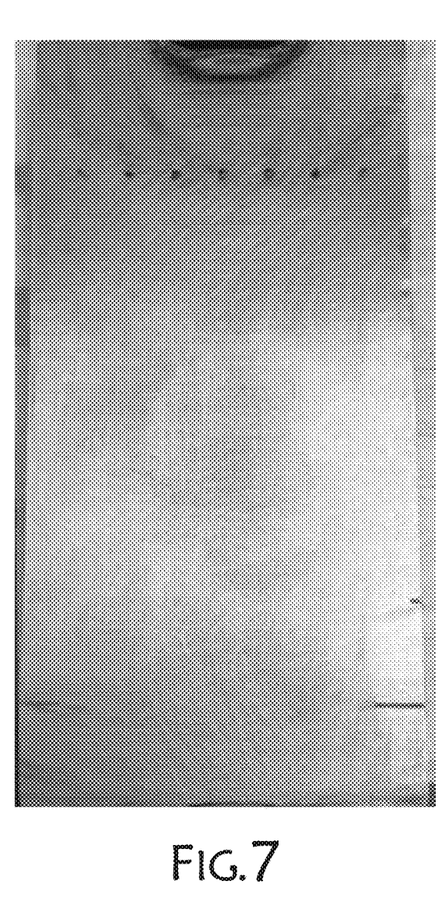
FIG. 7 is a TFM image illustrating an example implementation of a thick-film transducer and a corresponding volume, in accordance with some aspects of the technology described herein.

Embodiments described herein can be understood more readily by reference to the following illustrative examples 4A-B, 5A-B, 6A-B, and 7 showing waveforms of signals generated and subsequently processed to generate representative images of insonified substrate volumes. FIG. 4A shows an image reconstructions of a calibration block using a Synthetic Aperture Focusing Technigue (SAFT) algorithm, created using processes described herein. The image shows clear imaging of several side-drilled holes. FIG. 4B shows an image reconstructions of a calibration block using the Full Matrix Capture (FMC) Total Focusing Method (TFM) algorithm, created using processes described herein. The image shows clear imaging of several side-drilled holes. FIGS. 5A and 5B show example ultrasonic waveforms obtained from individual elements in the array, which in turn are inputs into one or more image processing algorithms. FIG. 6A is the FMC TFM image of the calibration block showing the imaging of a larger area than shown in FIG. 4B, including the imaging of several notches. FIG. 6B is the same as 6A but with the color scale adjusted to more easily identify the three notches toward the bottom of the calibration block. FIG. 7 shows the reconstructed image overlaid on a photograph of the calibration block to easily see the alignment of the indications in the UT data with the physical features of the calibration block.

Many different arrangements of the various components and/or steps depicted and described, as well as those not shown, are possible without departing from the scope of the claims below. Embodiments of the present technology have been described with the intent to be illustrative rather than restrictive. Alternative embodiments will become apparent from reference to this disclosure. Alternative means of implementing the aforementioned can be contemplated without departing from the scope of the claims below. Certain features and subcombinations are of utility and can be employed without reference to other features and subcombinations and are contemplated within the scope of the claims.

The invention claimed is:

1. A method of fabricating a thick-film transducer array, the method comprising:
   mixing a solid-liquid suspension with between about 40 wt. % to about 60 wt. % of said suspension of a ceramic powder and between about 40 wt. % to about 60 wt. % of said suspension of an aqueous inorganic binder solution;
   applying the solid-liquid suspension to a substrate in layers to create a coating of a desired thickness, the coating being a ceramic film;
   masking the ceramic film with a thin plastic sheet out of which the desired electrode pattern is cut using a computerized cutting machine to achieve a high resolution pattern;
   applying a conductive electrode material onto the masked area of the ceramic film; and
   heating the ceramic film and substrate to about 100° C. while applying a large electric field across the ceramic film to align the dipoles in said ceramic film.

2. The method of claim 1, wherein the solid-liquid suspension is applied to the substrate by nebulization with a pressurized device fitted with an atomizing nozzle.

3. The method of claim 1, wherein the ceramic powder is a piezoelectric powder, such as lead zirconate titanate, bismuth titanate, barium titanate, lithium niobate, neodymium titanate and mixtures thereof.

4. The method of claim 1, wherein the aqueous inorganic binder solution is at least one of a sodium silicate, lithium silicate, and potassium silicate.

5. The method of claim 1, wherein the solid-liquid suspension is applied in layers until the desired thickness is achieved.

6. The method of claim 5, wherein the desired thickness is dependent upon the desired resonant frequency of the transducer and in the range of about 125 to 200 µm.

7. The method of claim 1, wherein the masking material consists of a plastic such as polyethylene terephthalate (PET) or polyvinyl chloride (PVC).

8. The method of claim 1, wherein the electrode material consists of a suspension of a conductive powder and a binder system.

9. The method of claim 8 wherein the powder used in the suspension consists of a conductive powder such as silver, gold, platinum, and graphite.

10. The method of claim 1, wherein the electrode material is applied to the ceramic film by nebulization with a pressurized device fitted with an atomizing nozzle.

11. The method of claim 1, wherein the substrate material is an electrically conductive metal selected from at least one of aluminum, stainless steel, carbon steel, grade 11 steel, grade 22 steel and grade 91 steel.

* * * * *